United States Patent
Beatty, III et al.

(10) Patent No.: US 7,650,246 B2
(45) Date of Patent: Jan. 19, 2010

(54) PROCESS AND APPARATUS FOR ESTIMATING CIRCUIT DELAY

(75) Inventors: Harry J. Beatty, III, Clinton Corners, NY (US); David J. Hathaway, Underhill, VT (US); Alexander J. Suess, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 11/162,200

(22) Filed: Aug. 31, 2005

(65) Prior Publication Data

US 2007/0050160 A1    Mar. 1, 2007

(51) Int. Cl.
G01R 15/00    (2006.01)
G06F 19/00    (2006.01)

(52) U.S. Cl. ..................................... 702/57
(58) Field of Classification Search ............... 702/57, 702/65, 79, 189; 716/6, 307, 324, 327; 326/21, 326/83, 86; 703/13, 21, 23
See application file for complete search history.

(56) References Cited

U.S. PATENT DOCUMENTS

| | | | | |
|---|---|---|---|---|
| 5,521,783 | A |  | 5/1996 | Wolfe et al. ................... 361/56 |
| 5,946,175 | A |  | 8/1999 | Yu ............................... 361/56 |
| 6,091,593 | A |  | 7/2000 | Lin ............................. 361/111 |
| 6,449,578 | B1 | * | 9/2002 | McBride ....................... 702/119 |
| 6,621,673 | B2 |  | 9/2003 | Lin et al. ...................... 361/56 |
| 6,690,555 | B1 |  | 2/2004 | Pasqualini .................... 361/56 |
| 6,919,602 | B2 |  | 7/2005 | Lin et al. ..................... 257/360 |
| 2001/0036050 | A1 |  | 11/2001 | Lee et al. ..................... 361/56 |
| 2004/0263265 | A1 | * | 12/2004 | Allen et al. ................... 331/57 |
| 2005/0066297 | A1 | * | 3/2005 | Kalafala et al. ................ 716/6 |
| 2005/0068702 | A1 |  | 3/2005 | Connor et al. ................ 361/56 |

OTHER PUBLICATIONS

J. Wang, X. Lu, W. Qiu, Z. Yue, S. Fancler, W. Shi and D. M. H. Walker, "Static Compaction of Delay Tests Considering Power Supply Noise," May 2005, IEEE VLSI Test Symposium, Palm Springs, CA, pp. 235-240.*
S. Pant, D. Blaauw, V. Zolotov, S. Sundareswaran, R. Panda, "Vectorless Analysis of Supply Noise Induced Delay Variation," Nov. 11-13, 2003, ICCAD 2003, San Jose, CA, pp. 184-191.*
M. Hashimoto, J. Yamaguchi, H. Onodera, "Timing Analysis Considering Spatial Power/Ground Level Variation," Nov. 7-11, 2004, ICCAD 2004, San Jose, CA, pp. 814-820.*
V. Narayanan, B. Chappell, B. Fleischer, "Static Timing Analysis for Self Resetting Circuits," 1996, ICCAD 1996, San Jose, CA, pp. 119-126.*

* cited by examiner

*Primary Examiner*—Bryan Bui
(74) *Attorney, Agent, or Firm*—Richard Kotulak; Greenblum & Bernstein P.L.C.

(57) ABSTRACT

A method and device for determining a delay of a gate driven by a driving gate with different ground or supply voltages. The method includes determining from the supply and ground voltages for the driven gate and its driving gate an adjusted supply voltage value, and applying the adjusted supply voltage value as a single voltage parameter to a pre-characterized delay model for the driven gate. The device is structured to perform the method.

30 Claims, 7 Drawing Sheets

| Output Transition | Rule Delay Function Voltage | Gnd_src | Vdd_src | Gnd_sink | Vdd_sink |
|---|---|---|---|---|---|
| Rise | Vdd_driven − Gnd_driven | No Adjust Req'd | No Adjust Req'd | No Adjust Req'd | No Adjust Req'd |
| Rise | Vdd_driven − Gnd_driver | Gnd_driven | Gnd_driven + (Vdd_driven − Gnd_driver) | Gnd_driven | Vdd_driven |
| Fall | Vdd_driven − Gnd_driven | No Adjust Req'd | No Adjust Req'd | No Adjust Req'd | No Adjust Req'd |
| Fall | Vdd_driver − Gnd_driven | Vdd_driven − (Vdd_driver − Gnd_driven) | Vdd_driven | Gnd_driven | Vdd_driven |

Figure 5

PROCESS AND APPARATUS FOR ESTIMATING CIRCUIT DELAY

FIELD OF THE INVENTION

The present invention is directed to a process and device for estimating delay of a driven gate. Moreover, the invention is directed to a delay analyzer and to a computer program product for estimating delay.

DISCUSSION OF BACKGROUND INFORMATION

Conventional delay models for circuits or gates use at most one supply voltage parameter and do not separately consider supply and ground voltage shifts at driving blocks, which can affect the signal swing at the gate input and therefore affect the delay of the driven gate. Such supply and ground voltage differences may occur due to power supply noise, e.g., static power supply noise due to IR drop and/or transient power supply noise due to varying power demand interactions with image/package RLC distribution network. They also may occur in the presence of voltage islands, as described further below.

Circuit delay generally depends on both the supply voltage of the cell and the signal swing of its input, which in turn depends upon the source cell supply and ground voltages. In conventional delay models the input swing is assumed to match the cell's own ground-to-Vdd, and explicit level shifters are required to transmit signals between cells with large supply voltage differences. However, these are special cells level shifter cells have delays characterized with respect to multiple supply voltages. Level shifters are required when transmitting signals from a low supply voltage source cell to a high supply voltage sink cell to fully turn off devices in sink gate and thereby reduce noise sensitivity and power consumption in the sink cell. But level shifters are required when transmitting signals from a high supply voltage cell to a low supply voltage cell only to be able to bound delays in early mode timing analysis, and waste time, area, and power, since the circuit would operate correctly without them.

Moreover, sensitivity of delay to voltage increases at lower supply voltages necessary for low power, and thus the error in delay estimation incurred when the effect of source cell supply voltage is ignored also increases.

The significance of such variations has been shown by R. Ahmadi et al., "Timing Analysis in Presence of Power Supply and Ground Voltage Variations," ICCAD 2003, pp. 176-183, and S. Pant et al., "Vectorless Analysis of Supply Noise Induced Delay Variation," ICCAD 2003, pp. 184-191. These papers propose extending the characterization space for the gate delay to include additional parameters for the driving block ground and supply voltage. However this approach has several drawbacks. First, it would require recharacterizing or establishing additional delay models for the circuit library, thereby increasing rule size, and could not be applied without cooperation from the library provider. Second, each additional characterization dimension added to a gate delay characterization process can significantly increase (at least double) the delay characterization cost, and this cost can already require weeks if not months of simulation time.

Moreover, a more detailed journal article: L. Chen et al., "Buffer Delay Change in the Presence of Power and Ground Noise," IEEE Transactions on CAD, v. 11, n. 3, Jun. 2003, pp. 461-473, like the papers discussed above, proposes characterizing delay as a function of additional parameters, in this case representing the common mode and differential power supply noise on a cell.

With increasing use of voltage islands, it becomes more important to be able to accurately compute the delay of a driven gate whose supply and/or ground values differ from those of its driving gate. When the ground of a driven gate is significantly lower than that of its driving gate, a low signal will not completely turn off an NFET connected to ground in the driven gate. Similarly, when the supply voltage of a driven gate is significantly higher than that of its driving gate, a high signal will not completely turn off an PFET connected to the supply voltage in the driven gate. In either of these cases a level shifting circuit, whose delay is specially characterized as a function of two supply voltages, is required to prevent excessive current leakage. But in other cases (e.g., driving from a high voltage island to a low voltage island sharing a common ground) a level shifter is not electrically necessary. However some timing methodologies require level shifters in these cases as well because conventional timing analysis methods do not accurately model the delay variation caused by having a different supply voltage on the driving and driven gates, and may overestimate the early mode, or minimum cell delay, leading to invalid timing analysis of the design. These level shifters add area, power, and delay, and are thus undesirable.

While delay calculation language (DCL) provides for adjusting thresholds between cells, no specific formulas are described in the DCL specification, i.e., such adjustment is intended to be left to the rule developer. Moreover, this only addresses one aspect of delay from source/sink voltage differences.

Transistor-level timing analysis has been utilized, which performs circuit simulation during timing and is therefore able to directly model source/sink voltage differences. However this analysis is expensive and does not scale well to very large designs.

Thus, there is a need for a method which more accurately estimates the delay of a gate driven by a gate with different supply and/or ground voltages without requiring recharacterization of the gate delay library.

SUMMARY OF THE INVENTION

An embodiment of the present invention is directed to a method of determining a delay of a gate driven by a driving gate with different ground or supply voltages. The method includes determining from the supply and ground voltages for the driven gate and its driving gate an adjusted supply voltage value, and applying the adjusted supply voltage value as a single voltage parameter to a pre-characterized delay model for the driven gate.

According to a feature of the invention, the method can also include adjusting the delay of the driven gate in accordance with slew range differences.

An embodiment of the invention is directed to a process for determining at least one delay of a driven gate coupled to a driving gate. The process includes determining supply and ground voltages for the driven gate and driving gate, ascertaining a single voltage from the determined voltages, and determining the delay of the driven gate from the single voltage applied to a delay rule associated with the driven gate.

In accordance with a feature of the invention, the process may also include adjusting the delay of the driven gate for at least one of threshold shifts and slew range differences.

According to another feature of the present invention, for determining a delay from a rising transition, the reducing of the determined voltages corresponds to Vdd_src–Gnd_sink. The determined driving gate voltages are Vdd_src and Gnd_src, and the determined driven gate voltages are Vdd_sink and Gnd_sink. The process can also include determining whether the driven gate is a complex gate having multiple internal stages. Moreover, for the complex gate, the single voltage for an input stage is Vdd_src–Gnd_sink, and the single voltage for later stages is Vdd_sink–Gnd_sink.

In accordance with still another feature of the instant invention, for determining a delay from a falling transition, the single voltage corresponds to Vdd_sink–Gnd_src. The determined driving gate voltages are Vdd_src and Gnd_src, and the determined driven gate voltages are Vdd_sink and Gnd_sink. The process may also include determining whether the driven gate is a complex gate having multiple internal stages. Further, for the complex gate, the single voltage for an input stage is Vdd_sink–Gnd_src, and the single voltage for later stages is Vdd_sink–Gnd_sink.

According to a further feature of the invention, the process may also include determining whether a final voltage of an input to the driven gate is achieved before an output of the driven gate completes most of its transition, and, when the final voltage of the input to the driven gate is achieved before the output of the driven gate completes most of its transition, determining at least one of: a delay from a rising transition, in which the reducing of the determined voltages corresponds to Vdd_src–Gnd_sink and a delay from a falling transition, in which the reducing of the determined voltages corresponds to Vdd_sink–Gnd_src. The determined driving gate voltages are Vdd_src and Gnd_src, and the determined driven gate voltages are Vdd_sink and Gnd_sink.

The process may also include inferring that the driven gate is a single-stage gate when the output begins to transition almost immediately when the input passes a minimum logic threshold.

According to a still further feature of the present invention, adjusted and conventional values are utilized to compute late and early modes. For a late mode, the single voltage is ascertained from the following equations:

$$\text{delay\_rising\_in} = f(\min(\text{Vdd\_sink–Gnd\_sink}, \text{Vdd\_src–Gnd\_sink})) \text{ and}$$

$$\text{delay\_falling\_in} = f(\min(\text{Vdd\_sink–Gnd\_sink}, \text{Vdd\_sink–Gnd\_src})).$$

The determined driving gate voltages are Vdd_src and Gnd_src, and the determined driven gate voltages are Vdd_sink and Gnd_sink. For an early mode, the single voltage is ascertained from the following equations:

$$\text{delay\_rising\_in} = f(\max(\text{Vdd\_sink–Gnd\_sink}, \text{Vdd\_src–Gnd\_sink})) \text{ and}$$

$$\text{delay\_falling\_in} = f(\max(\text{Vdd\_sink–Gnd\_sink}, \text{Vdd\_sink–Gnd\_src})).$$

The determined driving gate voltages are Vdd_src and Gnd_src, and the determined driven gate voltages are Vdd_sink and Gnd_sink.

In accordance with still another feature of the invention, for unpredictable local variations in voltage the reducing of the determined voltages comprises the following equations:

for late mode:

$$\text{delay\_rising\_in} = f(\min(\text{Vdd\_sink\_min–Gnd\_sink\_max}, \text{Vdd\_src\_min–Gnd\_sink\_max})) \text{ and}$$

$$\text{delay\_falling\_in} = f(\min(\text{Vdd\_sink\_min–Gnd\_sink\_max}, \text{Vdd\_sink\_min–Gnd\_src\_max})); \text{ and}$$

for early mode.

$$\text{delay\_rising\_in} = f(\max(\text{Vdd\_sink\_max–Gnd\_sink\_min}, \text{Vdd\_src\_max–Gnd\_sink\_min})) \text{ and}$$

$$\text{delay\_falling\_in} = f(\max(\text{Vdd\_sink\_max–Gnd\_sink\_min}, \text{Vdd\_sink\_max–Gnd\_src\_min})).$$

The determined driving gate voltages are Vdd_src_min, Vdd_src_max, Gnd_src_min, and Gnd_src_max, and the determined driven gate voltages are Vdd_sink_min, Vdd_sink_max, Gnd_sink_min, and Gnd_sink_max.

According to a further feature of the instant invention, the gate is a multi-input gate having at least one switching input. When the switching input is falling and a non-switching input X is low, the process further includes including a value corresponding to Vdd_sink–Gnd_src_X in a minimum or maximum used to obtain the voltage for late or early delay calculation of the sink block, respectively, in which Vdd_sink represents a voltage of the driven gate and Gnd_src_X represents a ground voltage for the driving gate of the non-switching input X. Moreover, when the switching input is rising and a non-switching input X is high, the process further includes including a value corresponding to Vdd_src_X–Gnd_sink in a minimum or maximum used to obtain the voltage used for late or early delay calculation of the sink block, respectively, in which Vdd_src_X represents a voltage of the driving gate of the non-switching input X and Gnd_sink represents a ground voltage for the driven gate. Further still, the process can include computing the delays due to falling inputs using a maximum or minimum of Vdd_sink–Gnd_src_i for all inputs i when computing delays due to falling inputs, and computing the delays due to rising inputs using a maximum or minimum of Vdd_src_i–Gnd_sink for all inputs i when computing delays due to rising inputs. In this regard, Vdd_sink and Gnd_sink represent voltages of the driven gate, and Vdd_src_i and Gnd_src_i represent voltages of the driving gates for all inputs i of the driven gate.

In accordance with still another feature of the present invention, the process is performed in a static timing analyzer.

According to still another feature, the static timing analyzer is structured and arranged to perform the above-discussed process.

Further, the static timing analyzer is stored on a computer readable medium.

An embodiment of the instant invention is directed to a delay analyzer that includes a device to receive supply and ground voltages for the driven gate and driving gate, a control unit structured and arranged to produce a single voltage from the received voltages, and a device to ascertain from a delay rule stored in a pre-characterized model for the single voltage associated with the driven gate. The information of the delay analyzer is stored on a computer readable medium.

In accordance with a feature of the invention, the delay analyzer can further include a device for adjusting the received supply and ground voltages according to threshold shifts. Moreover, a device for adjusting the ascertained delay according to slew range differences can be included.

An embodiment of the present invention is directed to a computer program product comprising a computer usable medium including computer usable program code for determining driven gate delay. The computer program product includes computer usable program code for determining supply and ground voltages for the driven gate and driving gate, computer usable program code for producing a single voltage from the determined voltages, and computer usable program code for accessing, from a delay rule for the driven gate, the delay associated with the single voltage.

According to a feature of the invention, the code segment for producing the single voltage may include an algorithm that adjusts the determined supply and ground voltages according to threshold shifts.

Further, the code segment for producing the single voltage can include an algorithm that adjusts the ascertained delay according to slew range differences.

In accordance with still yet another feature of the present invention, the code segment for producing the single voltage can include an algorithm that determines a delay from a rising transition from the expression:

Vdd_src−Gnd_sink.

The algorithm determines a delay from a falling transition from the expression:

Vdd_sink−Gnd_src.

The determined driving gate voltages are Vdd_src and Gnd_src, and the determined driven gate voltages are Vdd_sink and Gnd_sink.

BRIEF DESCRIPTION OF THE DRAWINGS

FIG. 5 depicts a table for adjusting computed arrival times and slews;

DETAILED DESCRIPTION OF THE EMBODIMENTS OF THE INVENTION

The present invention is directed to determining at least one delay of a driven gate based on supply and ground voltages for the driven gate and its driving gate, using a precharacterized or established delay model for the driven gate which is a function of only a single voltage parameter. At least one adjusted voltage value to be applied to the delay model is determined from the supply and ground voltages for the driven gate and its driving gate. Further, the input slew, delay, and output slew of the driven gate can also be considered in determining the adjusted voltage, while a delay adjustment can be added to the input arrival time of the driven gate to account for differences in the delay measurement point between the driving and driven gates.

In the instant application, "Gnd_sink" and "Vdd_sink" will refer to the supply voltages of the driven gate (sink) and "Gnd_src" and "Vdd_src" will refer to the ground and supply voltages of the driving gate (source), all relative to the same reference. Since this reference is arbitrary, one could, without loss of generality, chose one of these voltages (e.g., Gnd_sink) to be the common reference, and a delay calculation subsystem employing the inventive method could be passed just the three remaining independent voltage values.

Figure 1:
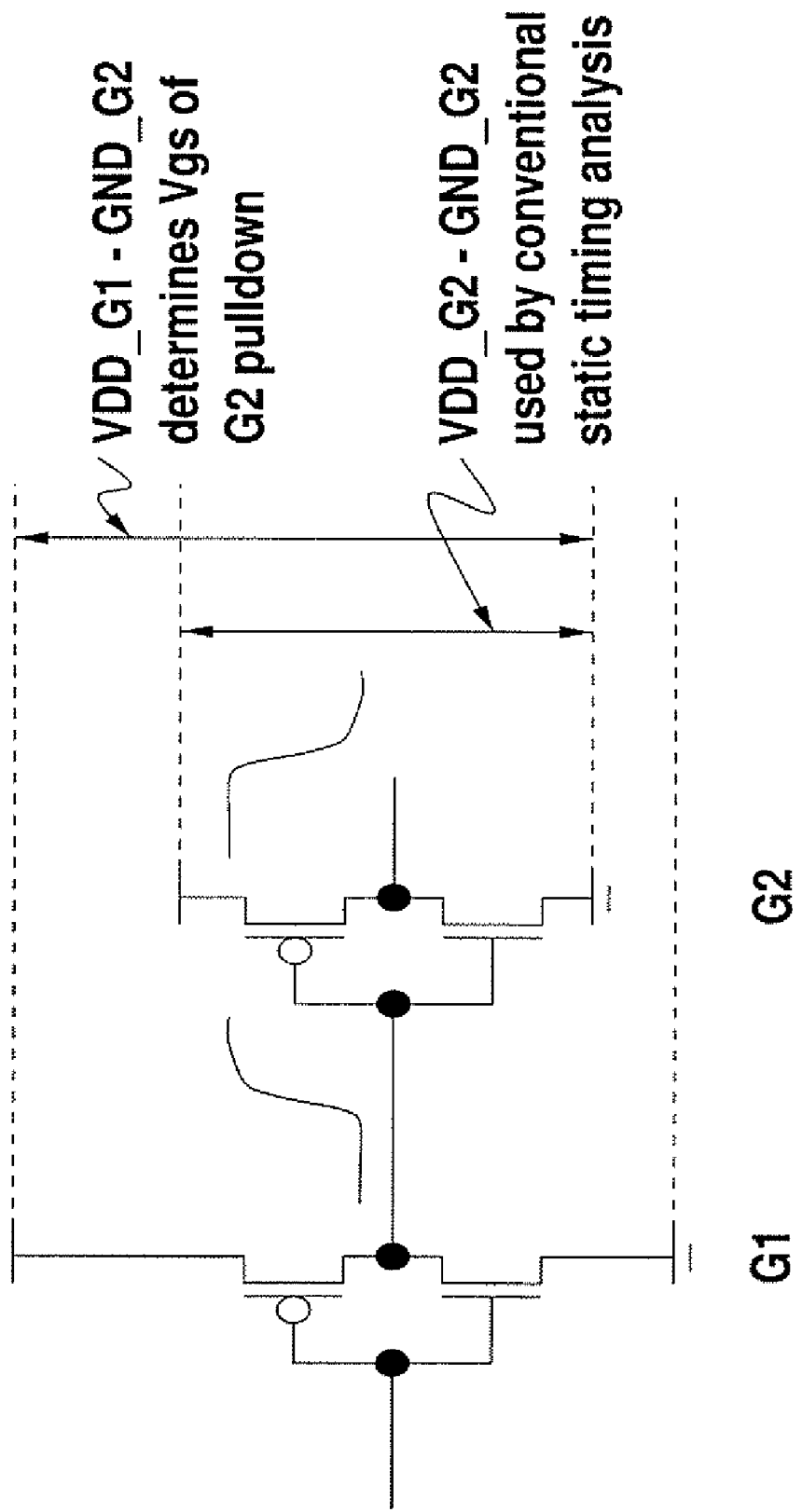
FIG. 1 illustrates a driver gate and driven gate operating at different ground-to-Vdd voltages.

FIG. 1 illustrates an inverter G2 (sink) driven by a signal from another inverter G1, i.e., source, whose high and low values, i.e., Vdd and ground, do not match those of the driven inverter. According to the invention, the case for both a rising and falling signal are considered. In each case, the Vgs value on the transistor in G2 which is driving its output transition is different than the VDD_G2−GND_G2 value which a conventional static timing analyzer, e.g., the IBM EinsTimer program, would normally use.

From this illustration, it can be seen that, in at least some cases, a delay from a rising transition on an input of a driven gate may be more accurately calculated as being a function of Vdd_src−Gnd_sink than of Vdd_sink−Gnd_sink, which is utilized by conventional timing analysis. Moreover, a delay from a falling transition on an input of a driven gate may be more accurately calculated in some cases as being a function of Vdd_sink−Gnd_src than of Vdd_sink−Gnd_sink, which is utilized by conventional timing analysis. The device which is turned off in each of these cases still sees a final off Vds voltage which is different from the adjusted voltages computed above. But this influence is far smaller than that of the Vgs applied to the device turning on to drive the transition, and thus the adjusted voltages described still form a good basis for delay calculation.

Although use of these adjusted voltages may be more accurate in some cases, in certain situations, additional computation may be necessary. For example, when the driven gate is a complex gate containing multiple internal stages, the adjusted voltages would be more correct for the input stage, while the conventional static timing analysis methods would be more accurate for later stages.

Figure 2:
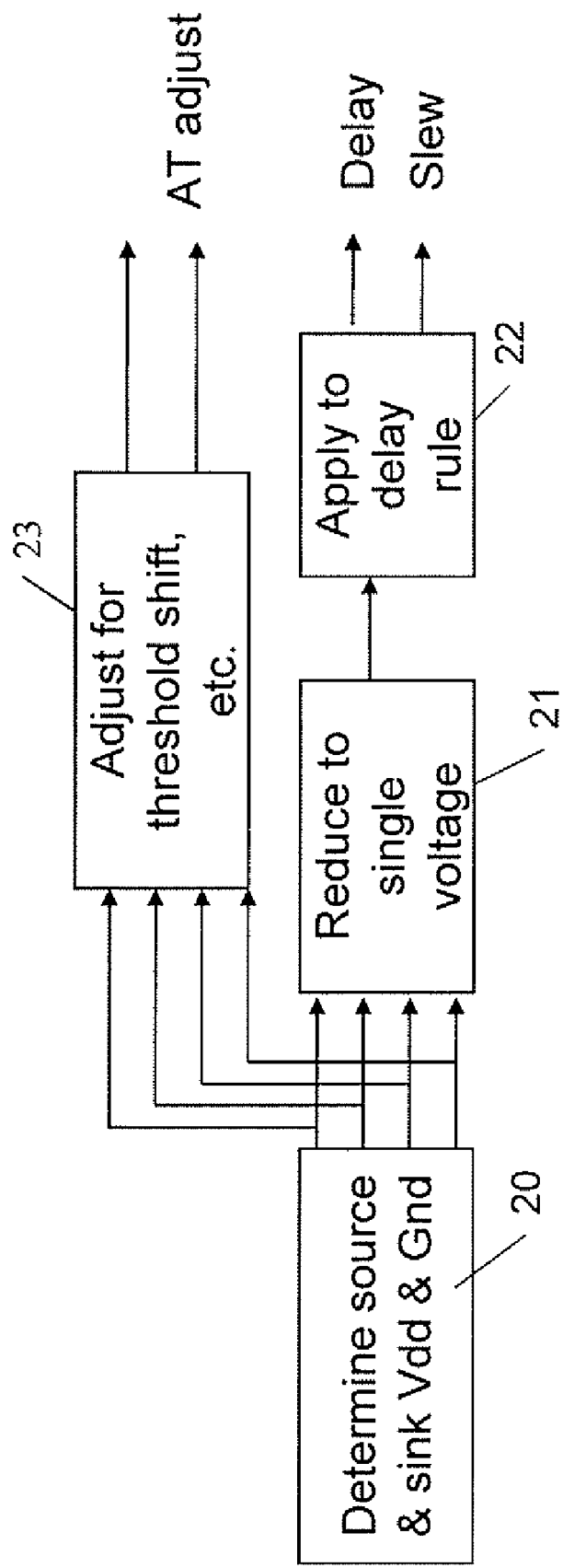
FIG. 2 schematically illustrates the instant invention.

As illustrated in FIG. 2, source and sink Vdd and Gnd are received at 20, and these values are reduced to a single voltage at 21. In the arrangement depicted in FIG. 1, the single voltage, depending upon rising and falling transitions, is calculated in the manner discussed above. Once the single voltage is determined, the single voltage is applied to a precharacterized delay rule at 22 in order to determine the delay. However, other adjustments, e.g., due to threshold shift, based upon the source and sink Vdd and Gnd are made at 23, as discussed below. Further, as discussed below, the single voltage can be adjusted for slew at 22.

Figure 3A:
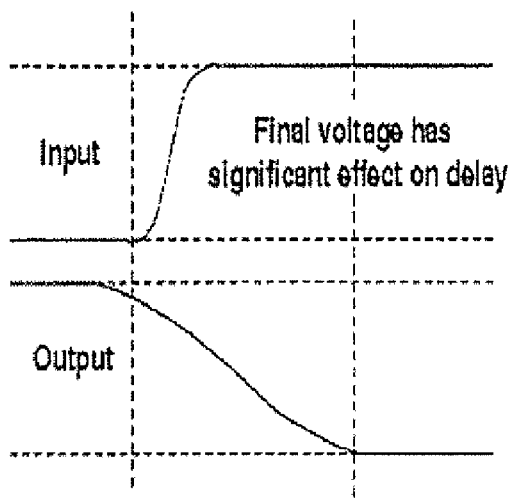
FIGS. 3a and 3b illustrate different slews at the input and output, respectively.
Figure 3B:
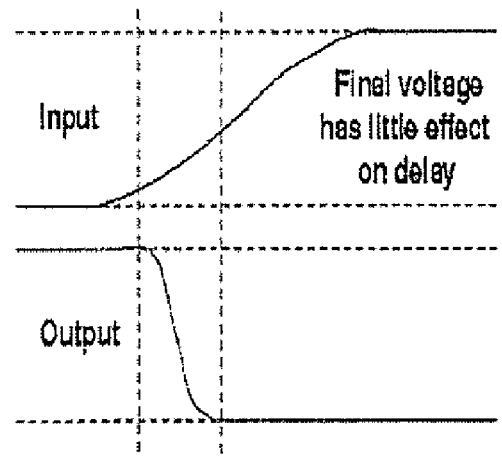

Input and output slews and delays can also be used to help determine whether an adjusted voltage should be applied. The adjusted voltages computed above provide additional accuracy when the final voltage of the input is reached before the output of the driven gate (or of its first internal stage in the case of a multiple-stage gate) completes most of its transition. As shown in FIG. 3a, because the final input voltage is achieved before the output of the driven gate completes most of its transition, the final voltage has a significant effect on delay, whereas, as shown in FIG. 3b, because the final input voltage is not achieved before the output of the driven gate completes its transition, the final voltage has little effect on delay.

Moreover, when additional information is provided about the library gate, i.e., indicating whether it is single-stage or multiple-stage, this information can be used in determining whether maximum and minimum values need to be applied, or whether the adjusted voltage can be used alone. In some cases, it may be possible to determine that a gate is a single stage by considering the input slew, delay, and output slew of the driven gate. If some minimum logic threshold for the gate library is known, e.g., the earliest in an input signal transition that it can begin to cause an output transition, we can determine whether enough time elapses between the input signal passing this threshold and the output signal beginning to make its transition for the existence of more than one stage in the gate. If the output begins to transition almost immediately when the input passes the minimum logic threshold, we can infer that this must be a single stage gate.

Thus, if a determination is made that the gate is a single-stage and its input signal completes its transition before the majority of the output transition has been completed, it is advantageous and reasonable to use the adjusted voltages described above for delay computation in accordance with the invention.

However, it may not always be possible to make the above-noted determination of single- or multiple-stage. In such an event, to ensure safe analysis, i.e., that values computed are not optimistic, the minimum of the adjusted and conventional voltage may be used to compute late mode or maximum delays, and the maximum of the adjusted and conventional voltage may be used to compute early mode or minimum delays. In this regard, the following equations are utilized:

$$delay\_early\_rising\_in=f(max(Vdd\_sink-Gnd\_sink, Vdd\_src-Gnd\_sink))$$

$$delay\_late\_rising\_in=f(min(Vdd\_sink-Gnd\_sink, Vdd\_src-Gnd\_sink))$$

$$delay\_early\_falling\_in=f(max(Vdd\_sink-Gnd\_sink, Vdd\_sink-Gnd\_src))$$

$$delay\_late\_falling\_in=f(min(Vdd\_sink-Gnd\_sink, Vdd\_sink-Gnd\_src))$$

The above-noted equations work because gate delay is almost always a monotonically decreasing function of voltage. However, if this is not reliably the case, delays may be computed using both the adjusted and conventional voltages, with the minimum delay used in early mode and the maximum delay used in late mode. It is noted that this may require additional delay computations, as other delay function parameters, e.g., Vdd_sink, Gnd_sink, Vdd_src, and Gnd_src, may have different values for late and early mode, such that the maximum and minimum of the same two computed delays may not be able to be used to determine the correct early and late mode delays.

In some cases there may be ranges for particular Vdd or Gnd values, which might represent unpredictable independent local variations in voltage. In such cases, one would use maximum Vdd and minimum Gnd for early values and minimum Vdd and maximum Gnd for late values:

$$delay\_early\_rising\_in=f(max(Vdd\_sink\_max-Gnd\_sink\_min,Vdd\_src\_max-Gnd\_sink\_min))$$

$$delay\_late\_rising\_in=f(min(Vdd\_sink\_min-Gnd\_sink\_max,Vdd\_src\_min-Gnd\_sink\_max))$$

$$delay\_early\_falling\_in=f(max(Vdd\_sink\_max-Gnd\_sink\_min,Vdd\_sink\_max-Gnd\_src\_min))$$

$$delay\_late\_falling\_in=f(min(Vdd\_sink\_min-Gnd\_sink\_max,Vdd\_sink\_min-Gnd\_src\_max))$$

If the ranges of voltage values are not independent, a combination of voltages can be utilized to pass to the delay rule which gives the maximum result for early mode calculations and that which gives the minimum value for late mode calculations.

An assumption is made here that body bias for the transistors in a gate (e.g., Nwell and Pwell or substrate contacts) are close to the gate, and therefore the supply voltages for the gate are approximately equal to its body bias voltages. If this is not true, the bounding method can be extended to use min(Vdd_sink, Nwell_sink) instead of Vdd_sink and max(Gnd_sink, Pwell_sink) instead of Gnd_sink for late delays and to use max(Vdd_sink, Nwell_sink) instead of Vdd_sink and min(Gnd_sink, Pwell_sink) instead of Gnd_sink for early delays. The Nwell and Pwell voltages for the source gate are not important, as they do not affect its output levels, which are all that influence the delay of the sink gate. If the gate delay was characterized with respect to independent values of Nwell and Pwell from the Vdd and ground values the well voltages may be used directly and this substitution is not needed.

Figure 4:
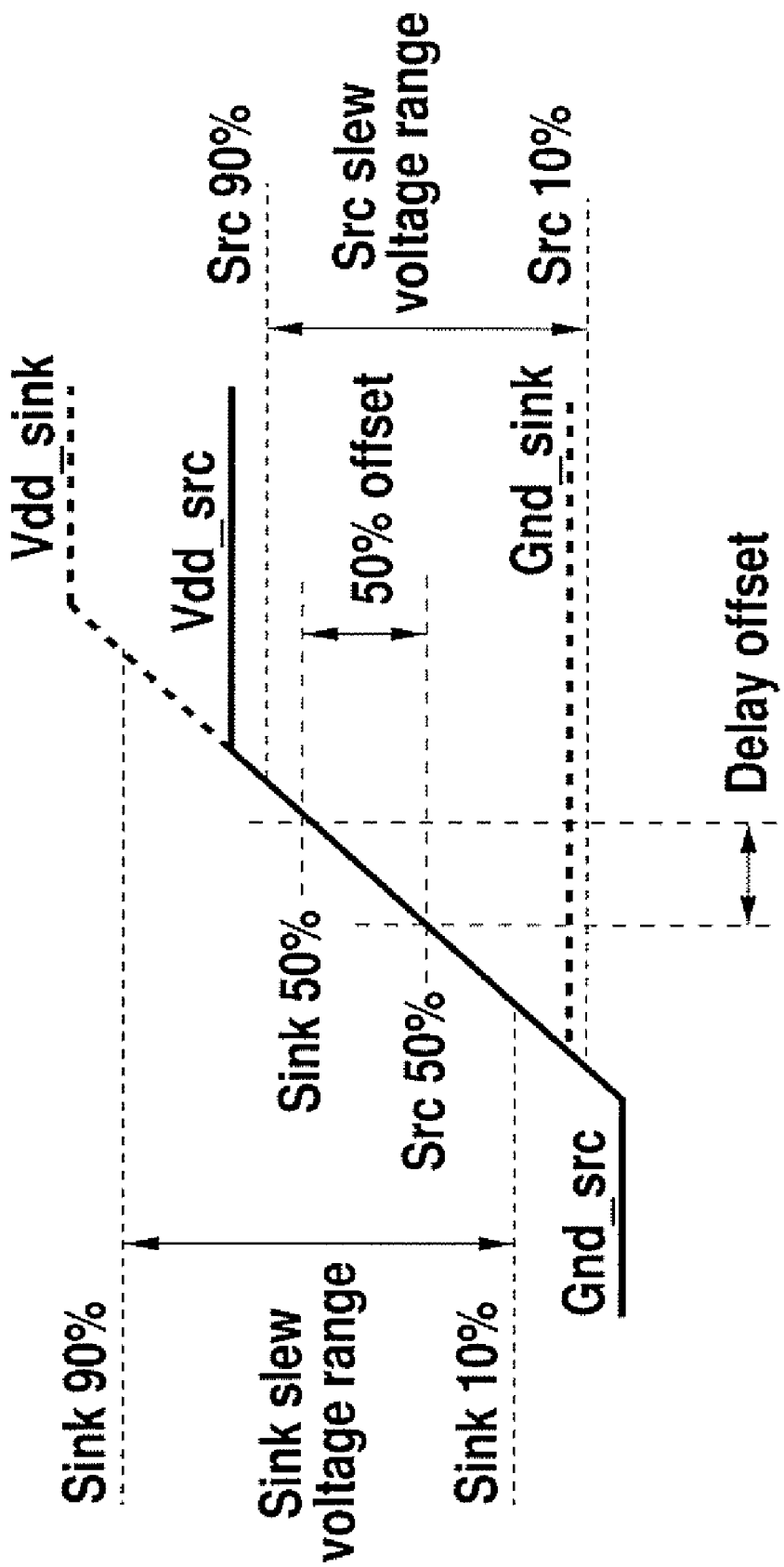
FIG. 4 illustrates accounting for shifts in delay thresholds and different power supply ranges for slew measurements.

The instant invention can also deal with differences in the voltage reference points used for delay calculation between the driving gate and driven gates. While FIG. 4 is based on modeling the slew as a simple ramp, it is recognized that a similar generalized approach may be used to handle other wave shape assumptions.

Based on above, the following delay adjustments would be added to the rising and falling arrival times at the input of a driven gate. For purpose of the following discussion, any wire delay between the source and sink gates is considered to be part of the source gate delay. Parameter FM defines the voltage crossing point at which signal arrival times are determined, as fraction of the supply voltage. For the usual 50% delay measurement FM=0.5. So delays are measured to and from when signals pass [Ground+(Supply-Ground)*FM]. That is, the source, or driving gate delay is characterized to the point when the driven gate's input reaches [Gnd_src+FM_src*(Vdd_src-Gnd_src)] and the sink, or driven gate delay is characterized from the point when its input reaches [Gnd_sink+FM_sink*(Vdd_sink-Gnd_sink)]. To fully generalize things, we allow for different FM values on the driven and driving gates and for rising and falling signals. This flexibility could be useful even without differences in the ground and supply of driving and driven gates, as the delays (output waveforms) of certain blocks may be more sensitive, e.g., due to different beta ratios, to crossings at certain points than others. Similarly, FS describes the voltage range between the points used for slew measurement, again as a fraction of the supply voltage, and separate values may be used for the source and sink gates and for rising and falling transitions. For a 10% to 90% of Vdd slew measurement we have FS=(0.9−0.1)=0.8. Thus delay and slew characterization for individual gates could be done using their own values of FM and FS. The following formula is applied to a slew (rise or fall) computed at the output of a driving gate (or at a sink of a net it drives) relative to the supply voltage of the source or driving gate, to produce an adjusted slew relative to the supply voltage of the driven or sink gate:

$$Slew\_sink\_in\_adjusted=Slew\_src\_out*[((Vdd\_sink-Gnd\_sink)*FS\_sink)/((Vdd\_src-Gnd\_src)*FS\_src)]$$

For FS_src=FS_sink this reduces to:

$$Slew\_sink\_in\_adjusted=Slew\_src\_out*[(Vdd\_sink-Gnd\_sink)/(Vdd\_src-Gnd\_src)]$$

The following formulae are used to compute arrival time adjustments which are added to the arrival times at the input to the sink gate which were computed relative to the supply voltage of the source or driving gate. The result is a corrected arrival time at the input of the driven or sink gate, relative to its supply voltage. The first line of each formula determines a time per voltage ramp rate for the signal independent of the supply voltage levels, and the remainder determines the voltage difference between the measurement reference points of the source and sink gates.

$$AT\_rising\_in\_adjustment=\{Slew\_src\_out/[FS\_src*(Vdd\_src-Gnd\_src)]\}*$$

$$\{[Gnd\_sink+FM\_sink*(Vdd\_sink-Gnd\_sink)]-$$

$$\{[Gnd\_src+FM\_src*(Vdd\_src-Gnd\_src)]\}$$

and

AT_falling_in_adjustment={Slew_src_out/[FS_src*(Vdd_src−Gnd_src)]}*

{[Gnd_src+FM_src*(Vdd_src−Gnd_src)]−

[Gnd_sink+FM_sink*(Vdd_sink−Gnd_sink)]}

For FS_src=FS_sink=FS and FM_src=FM_sink=0.5 these reduce to:

AT_rising_in_adjustment={Slew_src_out/[FS*(Vdd_src−Gnd_src)])*

{(Gnd_sink+Vdd_sink)−(Gnd_src+Vdd_src)}2 and

AT_falling_in_adjustment={Slew_src_out/[FS*(Vdd_src−Gnd_src)]}*

{(Gnd_src+Vdd_src)−(Gnd_sink+Vdd_sink)}/2

If Vdd and Gnd values can take on values from ranges of voltages, one would choose extremes which give maximum AT adjustments and slews for early mode and minimum AT adjustments and slews for late mode. For independent variations in the various Vdd and Gnd values this gives the following for slew adjustment:

Slew_sink_in_adjusted_late=Slew_src_out_late*
[((Vdd_sink_max−Gnd_sink_min)*FS_sink)/
((Vdd_src_min−Gnd_src_max)*FS_src)]

Slew_sink_in_adjusted_early=Slew_src_out_early*
[((Vdd_sink_min−Gnd_sink_max)*FS_sink)/
((Vdd_src_max−Gnd_src_min)*FS_src)]

AT_rising_in_adjustment_late={Slew_src_out_late/
[FS_src*(Vdd_src_min−Gnd_src_min)]}*{
[Gnd_sink_max+FM_sink*(Vdd_sink_max−
Gnd_sink_max)]−

[Gnd_src_min+FM_src*(Vdd_src_min−Gnd_src_
min)]}

AT_rising_in_adjustment_early={Slew_src_out_early/[FS_src*
(Vdd_src_max−Gnd_src_max)]}*{[Gnd_sink_
min+FM_sink*(Vdd_sink_min−Gnd_sink_
min)]−

[Gnd_src_max+FM_src*(Vdd_src_max−Gnd_src_
max)]}

AT_falling_in_adjustment_late={Slew_src_out_late/
[FS_src*(Vdd_src_max−Gnd_src_max)]}*{
[Gnd_src_max+FM_src*(Vdd_src_max−Gnd_
src_max)]−

[Gnd_sink_min+FM_sink*(Vdd_sink_min−Gnd_
sink_min)]}

AT_falling_in_adjustment_early={Slew_src_out_early/[FS_src*
(Vdd_src_min−Gnd_src_min)]}*{[Gnd_src_
min+FM_src*(Vdd_src_min−Gnd_src_min)]−

[Gnd_sink_max+FM_sink*(Vdd_sink_max−Gnd_
sink_max)]}

To understand why the extremes shown were chosen for the AT adjustments, consider FIG. 4, and note that for a rising transition, moving Vdd_src lower, Gnd_src lower, Vdd_sink higher, or Gnd_sink higher will all result in a sink arrival time measurement point which is later relative to the source arrival time measurement point. Therefore these extremes give the maximum arrival time adjustment, which is appropriate for late mode, and the opposite extremes give the minimum arrival time adjustment, which is appropriate for early mode. A similar analysis results in the values given above for falling transitions.

In addition to the foregoing, if the single voltage value passed to the rule delay function is not the Vdd-Gnd of the cell whose delay is being computed, the resulting delay and slew from the rule delay and slew functions will not be relative to the correct voltage range. Thus, adjustments must be made to the arrival time and slew at the cell output in a manner similar to that described above at the cell input to adjust the arrival time and to compute slews relative to the driving block Vdd and Gnd to values which are correct relative to the Vdd and Gnd of the driven cell. The same computations as discussed above are performed, but in this case the "_src" information is related to the voltage value passed to the rule delay function, and the "_sink" information is relative to the actual Vdd and Gnd of the driven cell. In performing this second adjustment, one must identify the starting point of the output transition, which is Gnd of the driven cell for rising output transitions and Vdd of the driven cell for falling output transitions. This value should be considered common between the "_src" and "_sink" values, and the other "_src" value, i.e., Vdd for rising output transitions and Gnd for falling output transitions, will be determined by adding or subtracting the single voltage value passed to the rule delay function. These calculations are provided in the table shown in FIG. 5.

According to a further aspect of the invention, the delay of a multi-input gate may depend on the conductivity of a stack of series transistors, e.g., the pull-down NFETs in a NAND gate. One of these will be switching, and its voltage can be determined in accordance with the above-described process. However if a non-switching input has a particularly high or low voltage, it may speed up or slow down the gate output transition so that the minimum or maximum voltage values described in the disclosure are no longer reliable bounds on the gate delay.

Thus, the process is extended to address this issue by considering the supply and ground voltages of the circuits driving all of a cell's inputs when determining the single voltage to apply to the delay rule.

If the switching input is falling and a non-switching input X is low, one would consider Vdd_sink−Gnd_src_X, including it in the minimum or maximum used to obtain the voltage used for late or early delay calculation of the sink block, respectively. If the switching input is rising and a non-switching input X is high, one would consider Vdd_src_X−Gnd_sink, including it in the minimum or maximum used to obtain the voltage used for late or early delay calculation of the sink block, respectively. As it is understood that one does not often know what side input sensitizations are needed to enable a switching input to propagate a signal to an output, to be conservative one could consider the maximum or minimum of Vdd_sink−Gnd_src_i for all inputs i when computing delays due to falling inputs, and always consider the maximum or minimum of Vdd_src_i−Gnd_sink for all inputs i when computing delays due to rising inputs.

If a switching input is rising and a non-switching input is low, or if a switching input is falling and a non-switching input is high, we know that, in any normal CMOS gate, a transistor whose gate is fed by the non-switching input will not be in a series stack with a transistor whose gate is fed by the switching input, because such a stack would have to include both PFETs and NFETs to be turned on and, therefore, become the path controlling an output transition. So, the source Vdd and ground voltages of this input can normally be omitted from the maximum or minimum.

If it is known that a particular input does not feed a transistor which is in a series stack with a transistor fed by another non-switching input, the source voltages associated with that non-switching input may be omitted from the minimum or maximum. Such knowledge of stack structure could be explicitly obtained from cell data, or might be inferred from the gate function. For example, in an AND/OR/INVERT gate, two inputs in the same AND leg might be inferred to appear together in an NFET stack, such that their voltages would both be used in computing the delay due to either input rising. However, inputs in different AND legs would be inferred to appear in different NFET stacks, such that their voltages would not be used together in computing delays due to either input rising. However, devices in different AND legs would be inferred to appear together in a PFET stack, such that their voltages would be used together in computing delays due to either input falling. It is noted that this functional inference is essentially equivalent to determining the required side input sensitizations for propagating a transition from an input to an output, and thus is similar to the first variation of the extension of the process in which the supply and ground voltages of the circuits driving all of a cell's inputs when determining the single voltage to apply to the delay rule are considered.

Figure 6:
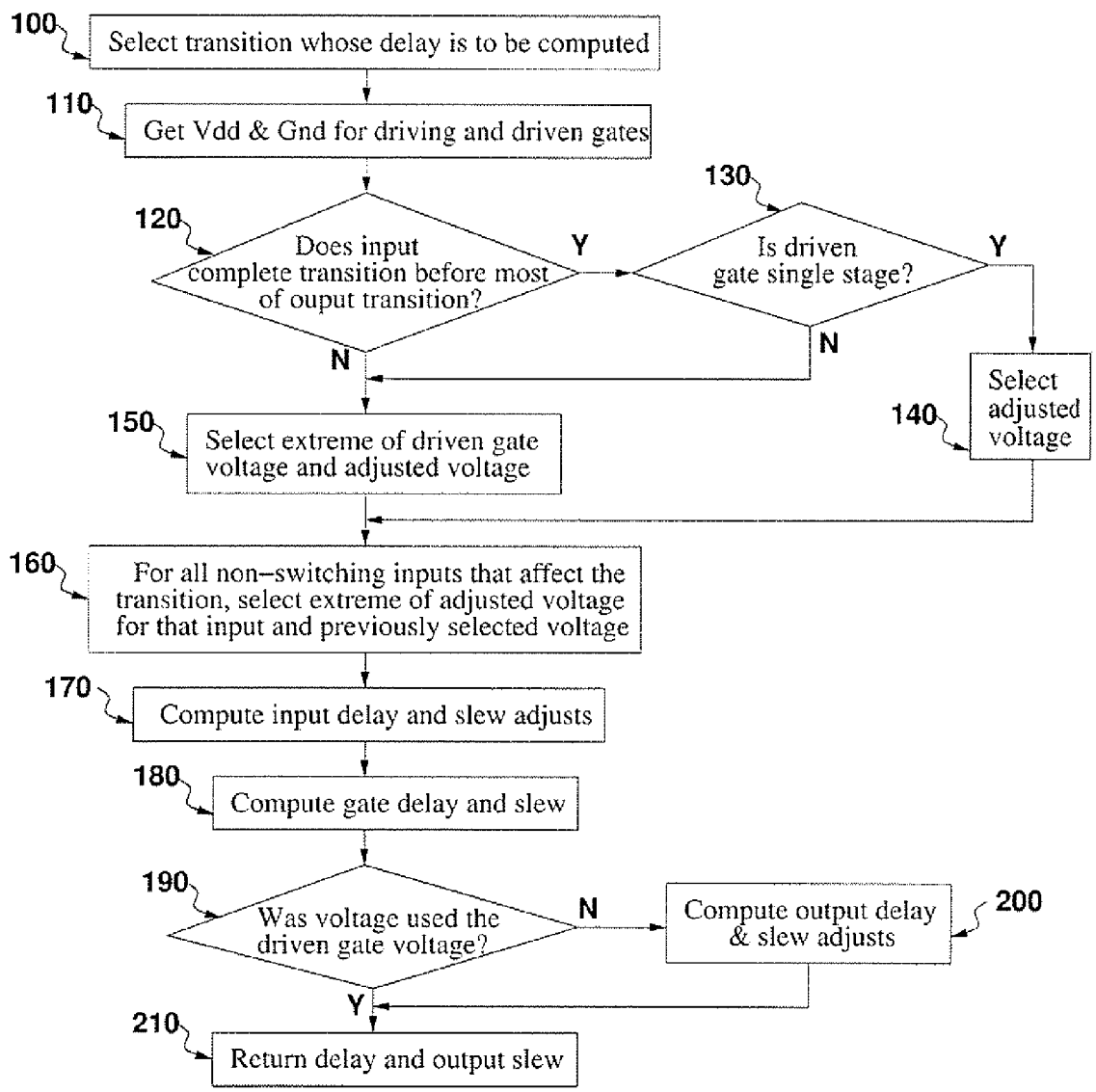
FIG. 6 is a flow diagram of the process for determining the delay of the driven gate.

The process for determining delay of the driven gate is shown in the flow chart of FIG. 6. In step 100, a transition is selected whose delay is to be computed. This includes at least a gate, an input pin, transition (rise or fall), and slew, and an output pin and transition. It may also include states of other non-switching inputs.

In step 110, Vdd and Gnd voltages are obtained for the driven gate, whose delay is being computed, and for the driving gate.

In step 120, an optional determination is made whether the input transition completes its transition before the output completes most of its transition, see FIGS. 3a and 3b. This might be determined by computing an initial delay and output slew for the driven gate using only its voltages (i.e., according to known methods), determining based on the input slew, initial delay and output slew, the approximate percentage of the output transition that will have completed when the input transition is completed. For example, for specified constant $K_{120}$, input slew Si, initial delay D and initial output slew So, the question might be mathematically expressed as: "is $(0.625*Si-D+0.625*So)/So<K_{120}$?" In this equation, the numerator expresses approximately how long the input is still switching after the output starts switching, and the denominator expresses how long it takes the output to complete its transition. The input transition is considered to complete before most of the output transition if the inequality is satisfied.

Step 130 optionally determines whether the gate is single stage. This might be specified by the library, or, for constants $K_{130}$ (unrelated to the constant $K_{120}$ used in step 120), input slew Si, initial delay D and initial slew So, may be estimated mathematically by determining whether $K_{130}*Si>D-0.625*So$. In this equation, the left side of the inequality expresses when the input reaches some switching threshold, and constant $K_{130}$ would typically be between −0.625 and 0.625. The right side of the inequality expresses when the output begins to switch. The gate would be considered to be single stage if the inequality is satisfied.

If queries in steps 120 and 130 are affirmative, step 140 simply selects only the adjusted voltage, as described above with reference to FIG. 1, (i.e., a difference between a Vdd or Gnd of the driving gate and a Vdd or Gnd of the driven gate, the difference chosen depending on whether the input transition is rising or falling). Otherwise, i.e., if either query in steps 120 and 130 are negative, or if these optional queries are not performed, step 150 uses the extreme of the Vdd-Gnd for the driven gate and the adjusted voltage, in which the extreme is a maximum or minimum, depending on whether an early (minimum) or late (maximum) delay is being computed, respectively.

Step 160 considers other non-switching inputs which may affect the delay being computed, as described above. If it is not known which non-switching inputs affect the delay, all non-switching inputs may be considered. If the state of these non-switching inputs when the transition of interest occurs is known, the adjusted voltages may be computed only for those states, i.e., for an input which is low, the adjusted voltage will be Vdd_driven−Gnd_driving, and, for an input which is high, the adjusted voltage will be Vdd_driving−Gnd_driven. In these expressions the "driving" voltage is the appropriate supply voltage of the gate driving the non-switching input, and not that of the gate driving the switching input.

Step 170 computes the input delay and slew adjusts as described in FIG. 4.

Step 180 computes the gate delay and output slew by inputting the voltage selected earlier to the known delay calculation method from step 120.

Step 190 determines whether the voltage in step 180 was the Vdd−Gnd of the driven gate. If not, an output delay and slew adjustment is applied in step 200, as described in FIG. 5.

Finally, step 210 returns the delay (including input and output adjustments) and the output slew (including any output slew adjustment).

Figure 7:
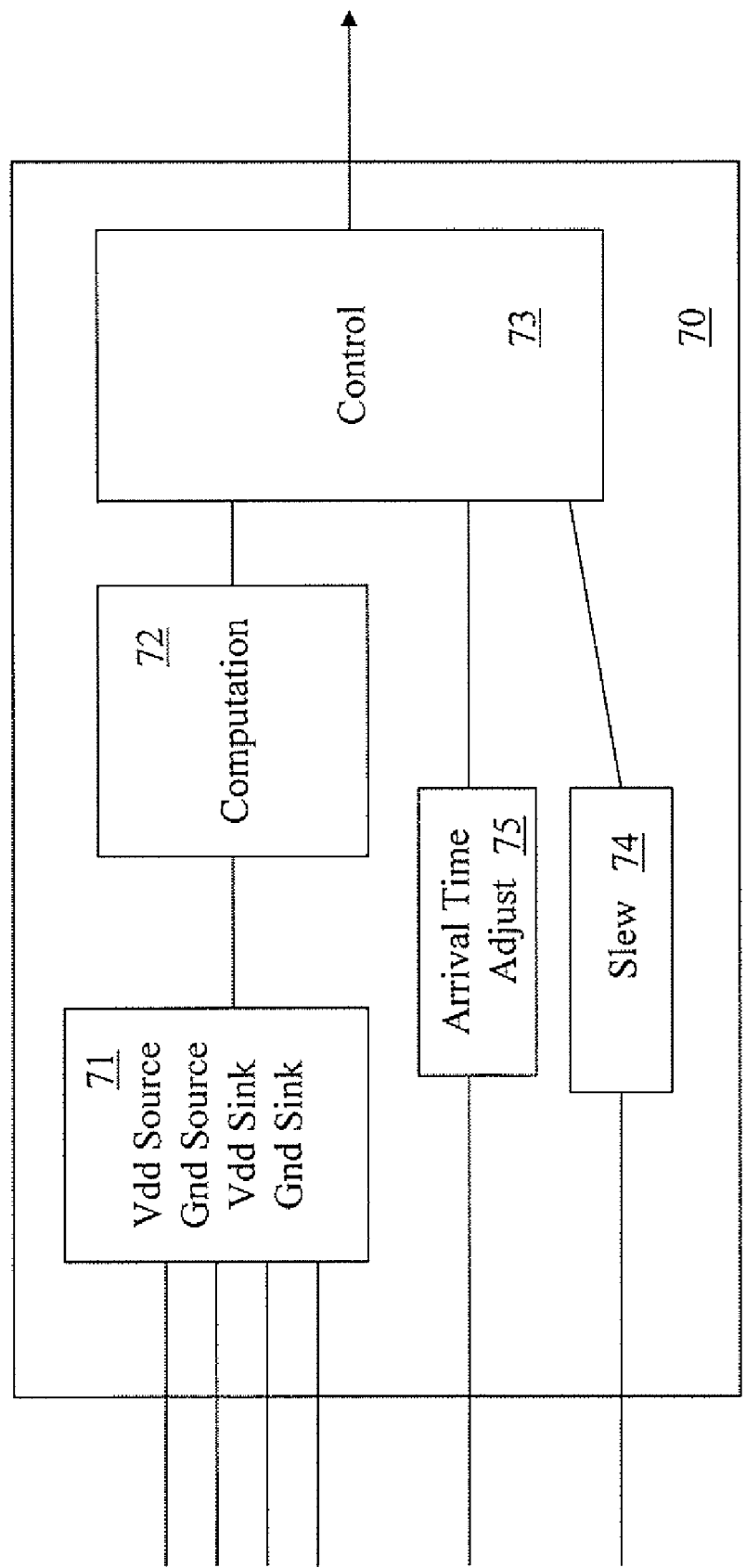
FIG. 7 illustrates an exemplary embodiment of an apparatus in accordance with the features of the invention.

Further, an embodiment of the present invention is directed to an apparatus structured and arranged to estimate delay in the driven device. An exemplary embodiment of the apparatus is illustrated in FIG. 7, in which delay device 70 includes an element 71 for receiving Vdd and Gnd values for both the source element and sink element. A computation device 72 calculates the single voltage for the received values, and a control device 73 accesses the delay rule for the driven element. The delay rule may be stored in delay device 70 or may be stored remote from delay device 70, but in any event the delay is accessible by control device 73 to ascertain the delay. Moreover, the delay accessed from the delay rule can be output from control device 70 or, in the event of the above-noted factors, e.g., threshold shift, slew, etc., the delay may be adjusted in control device 73. In this regard, an element 74 determines the slew for the driven device, and this slew is forwarded to control device 73 for adjustment of the single voltage in the manner discussed above. Further, an element 75 monitors threshold shift to determine whether any arrival time adjustments to the element are necessary, and these adjustments are forwarded to control device 73, so that control device 73 outputs the delay for the driven element.

The delay device can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method of determining a delay of a driven gate driven by a respective driving gate with ground or supply voltages different from ground or supply voltages of the driven gate, comprising:
    determining an adjusted supply voltage value from the supply and ground voltages for the driven gate and the respective driving gate; and
    applying the adjusted supply voltage value as a single voltage parameter to a pre-characterized delay model with a delay rule for the driven gate to determine the delay.

2. The method in accordance with claim 1, further comprising:
    adjusting the delay of the driven gate in accordance with slew range differences.

3. A process for determining at least one delay of a driven gate coupled to a driving gate, comprising:
    determining supply and ground voltages for the driven gate and driving gate;
    ascertaining a single voltage from the determined voltages; and
    determining the delay of the driven gate from the single voltage applied to a delay rule stored in a pre-characterized model and associated with the driven gate.

4. The process in accordance with claim 3, further comprising:
    adjusting the delay of the driven gate for at least one of threshold shifts and slew range differences.

5. The process in accordance with claim 3, wherein for determining a delay from a rising transition, the reducing of the determined voltages corresponds to Vdd_src−Gnd_sink,
    wherein the determined driving gate voltages are Vdd_src and Gnd_src, and the determined driven gate voltages are Vdd_sink and Gnd_sink.

6. The process in accordance with claim 5, further comprising:
    determining whether the driven gate is a complex gate having multiple internal stages.

7. The process in accordance with claim 6, wherein, for the complex gate, the single voltage for an input stage is Vdd_src−Gnd_sink and the single voltage for later stages is Vdd_sink−Gnd_sink.

8. The process in accordance with claim 3, wherein, for determining a delay from a falling transition, the single voltage corresponds to Vdd_sink−Gnd_src,
    wherein the determined driving gate voltages are Vdd_src and Gnd_src, and the determined driven gate voltages are Vdd_sink and Gnd_sink.

9. The process in accordance with claim 8, further comprising:
    determining whether the driven gate is a complex gate having multiple internal stages.

10. The process in accordance with claim 9, wherein, for the complex gate, the single voltage for an input stage is Vdd_sink−Gnd_src and the single voltage for later stages is Vdd_sink−Gnd_sink.

11. The process in accordance with claim 3, further comprising:
    determining whether a final voltage of an input to the driven gate is achieved before an output of the driven gate completes most of its transition, and
    when the final voltage of the input to the driven gate is achieved before the output of the driven gate completes most of its transition, determining at least one of:
    a delay from a rising transition, in which the reducing of the determined voltages corresponds to Vdd_src−Gnd_sink; and
    a delay from a falling transition, in which the reducing of the determined voltages corresponds to Vdd_sink−Gnd_src,
    wherein the determined driving gate voltages are Vdd_src and Gnd_src, and the determined driven gate voltages are Vdd_sink and Gnd_sink.

12. The process in accordance with claim 3, further comprising, inferring that the driven gate is a single-stage gate when the output begins to transition almost immediately when the input passes a minimum logic threshold.

13. The process in accordance with claim 3, wherein adjusted and conventional values are utilized to compute late and early mode delays.

14. The process in accordance with claim 13, wherein, for a late mode delay, the single voltage is ascertained from the following equations:

$$\text{delay\_rising\_in} = f(\min(\text{Vdd\_sink}-\text{Gnd\_sink}, \text{Vdd\_src}-\text{Gnd\_sink})) \text{ and}$$

$$\text{delay\_falling\_in} = f(\min(\text{Vdd\_sink}-\text{Gnd\_sink}, \text{Vdd\_sink}-\text{Gnd\_src})),$$

wherein the determined driving gate voltages are Vdd_src and Gnd_src, and the determined driven gate voltages are Vdd_sink and Gnd_sink.

15. The process in accordance with claim 13, wherein, for an early mode delay, the single voltage is ascertained from the following equations:

delay_rising_in=$f$(max(Vdd_sink−Gnd_sink, Vdd_src−Gnd_sink)) and delay_falling_in=$f$(max(Vdd_sink−Gnd_sink, Vdd_sink−Gnd_src)), wherein the determined driving gate voltages are Vdd_src and Gnd_src, and the determined driven gate voltages are Vdd_sink and Gnd_sink.

16. The process in accordance with claim 3, wherein, for unpredictable local variations in voltage the reducing of the determined voltages comprises the following equations:

for late mode:

delay_rising_in=$f$(min(Vdd_sink_min−Gnd_sink_max,Vdd_src_min−Gnd_sink_max)) and delay_falling_in=$f$(min(Vdd_sink_min−Gnd_sink_max,Vdd_sink_min−Gnd_src_max)); and for early mode:

delay_rising_in=$f$(max(Vdd_sink_max−Gnd_sink_min,Vdd_src_max−Gnd_sink_min)) and delay_falling_in=$f$(max(Vdd_sink_max−Gnd_sink_min,Vdd_sink_max−Gnd_src_min)), wherein the determined driving gate voltages are Vdd_src and Gnd_src and the determined driven gate voltages are Vdd_sink and Gnd_sink.

17. The process in accordance with claim 3, wherein the driven gate is a multi-input gate having at least one switching input.

18. The process in accordance with claim 17, wherein, when the switching input is falling and a non-switching input X is low, the process further comprises including a value corresponding to Vdd_sink−Gnd_src_X in a minimum or maximum used to obtain the voltage for late or early delay calculation of the sink block, respectively, and wherein Vdd_sink represents a voltage of the driven gate and Gnd_src_X represents a ground voltage for the driving gate of the non-switching input X.

19. The process in accordance with claim 17, wherein, when the switching input is rising and a non-switching input X is high, the process further comprises including a value corresponding to Vdd_src_X−Gnd_sink in a minimum or maximum used to obtain the voltage used for late or early delay calculation of the sink block, respectively, and wherein Vdd_src_X represents a voltage for the driving gate of the non-switching input X and Gnd_sink represents a ground voltage for the driven gate.

20. The process in accordance with claim 17, further comprising:

computing the delays due to falling inputs using a maximum or minimum of Vdd_sink−Gnd_src_i for all inputs i when computing delays due to falling inputs; and computing the delays due to rising inputs using a maximum or minimum of Vdd_src_i−Gnd_sink for all inputs i when computing delays due to rising inputs, wherein Vdd_sink and Gnd_sink represent voltages of the driven gate, and Vdd_src_i and Gnd_src_i represent voltages all inputs i for the driving gate.

21. The process in accordance with claim 3, wherein the process is performed in a static timing analyzer.

22. A static timing analyzer, comprising:

a determination device to determine an adjusted supply voltage value from supply and ground voltages for a driven gate and a respective driving gate arranged to drive the driven gate; and an application device to apply the adjusted supply voltage value as a single voltage parameter to a pre-characterized delay model having a delay rule for the driven gate to determine a delay of the driven gate.

23. The static timing analyzer in accordance with claim 22, wherein information of the static timing analyzer is stored on a computer readable medium.

24. A delay analyzer comprising:

a device to receive supply and ground voltages for the driven gate and driving gate;

a control unit structured and arranged to produce a single voltage from the received voltages; and a device to ascertain delay from a delay rule stored in a pre-characterized model for the single voltage associated with the driven gate.

25. The delay analyzer in accordance with claim 24, further comprising:

a device for adjusting the received supply and ground voltages according to threshold shifts.

26. The delay analyzer in accordance with claim 24, further comprising:

a device for adjusting the ascertained delay according to slew range differences.

27. A computer program product comprising a computer readable medium including computer usable program code for determining driven gate delay, said computer program product including:

computer usable program code for determining supply and ground voltages for the driven gate and driving gate;

computer usable program code for producing a single voltage from the determined voltages; and computer usable program code for accessing, from a delay rule, stored in a pre-characterized model, for the driven gate, the delay associated with the single voltage.

28. The computer program product in accordance with claim 27, wherein the code segment for producing the single voltage includes an algorithm that adjusts the determined supply and ground voltages according to threshold shifts.

29. The computer program product in accordance with claim 27, wherein the code segment for producing the single voltage includes an algorithm that adjusts the ascertained delay according to slew range differences.

30. The computer program product in accordance with claim 27, wherein the code segment for producing the single voltage includes an algorithm that determines a delay from a rising transition from the expression:

Vdd_src−Gnd_sink, wherein the algorithm determines a delay from a falling transition from the expression:

Vdd_sink−Gnd_src, wherein the determined driving gate voltages are Vdd_src and Gnd_src, and the determined driven gate voltages are Vdd_sink and Gnd_sink.

* * * * *

UNITED STATES PATENT AND TRADEMARK OFFICE
CERTIFICATE OF CORRECTION

PATENT NO. : 7,650,246 B2  Page 1 of 1
APPLICATION NO. : 11/162200
DATED : January 19, 2010
INVENTOR(S) : Beatty, III et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 199 days.

Signed and Sealed this

Twenty-third Day of November, 2010

David J. Kappos
*Director of the United States Patent and Trademark Office*